United States Patent [19]
Sharrit

[11] Patent Number: 5,588,142
[45] Date of Patent: Dec. 24, 1996

[54] METHOD FOR SIMULATING A CIRCUIT

[75] Inventor: David Sharrit, Santa Rosa, Calif.

[73] Assignee: Hewlett-Packard Company, Palo Alto, Calif.

[21] Appl. No.: 440,204

[22] Filed: May 12, 1995

[51] Int. Cl.$^6$ .......................... G06F 9/455; G06F 17/50
[52] U.S. Cl. .......................... 395/500; 364/578; 364/489
[58] Field of Search .......................... 395/500; 364/488, 364/489, 499, 491, 578, 580, 802; 375/10

[56] References Cited

U.S. PATENT DOCUMENTS

| | | | |
|---|---|---|---|
| 4,791,593 | 12/1988 | Hennion | 364/578 |
| 4,918,643 | 4/1990 | Wong | 364/802 |
| 5,025,402 | 6/1991 | Winkelstein | 364/578 |
| 5,148,379 | 9/1992 | Konno et al. | 364/578 |
| 5,233,628 | 8/1993 | Rappaport et al. | 375/10 |
| 5,335,191 | 2/1994 | Kundert et al. | 364/578 |
| 5,349,539 | 9/1994 | Moriyasu | 364/578 |
| 5,369,594 | 11/1994 | Huang et al. | 364/489 |
| 5,379,231 | 3/1995 | Pillage et al. | 364/488 |
| 5,467,291 | 11/1995 | Fan et al. | 364/578 |
| 5,469,366 | 11/1995 | Yang et al. | 364/489 |

OTHER PUBLICATIONS

"Jacobian Calculation Using the Multidimensional Fast Fourier Transform in the Harmonic Balance Analysis of Nonlinear Circuits", by P. Heron and M. Steer, IEEE Transactions on Microwave Theory and Techniques, vol. 38, No. 4, Apr. 1990, pp. 429–431.

"Analysis of Nonlinear Microwave Circuits Using the Compression Approach", by Kunisch et al., IEEE, MTT–S International Microwave Symposium Digest, Jan. 1993, pp. 637–640.

"A Consistent Nonlinear Simulation Environment Based on Improved Harmonic Balance Techniques", by J. Yao and A. Yang, IEEE, European Design Automation Conference 1993 and Euro–VHDL 1993, Jan. 1993, pp. 90–95.

*Primary Examiner*—Kevin J. Teska
*Assistant Examiner*—Russell W. Frejd

[57] ABSTRACT

An improved circuit simulator for simulating the response of a circuit to a transient. The stimulating signal is represented by one or more carriers having time varying modulation envelopes. The simulator differs from a harmonic balance simulator in that the currents provided by each of the device subroutines include an additional term at each carrier frequency having the time dependency of the modulation envelope at that frequency. These additional current terms necessitate a time-domain solution of the simulation problem; however, the time steps are now determined by the time variation of the envelope instead of the time variation of the carrier. As a result, the number of time steps needed in the simulation is greatly reduced. The present invention may be implemented by modifying a conventional harmonic balance simulator. The modifications involve adding code to the various device routines to provide the current term corresponding to the modulation envelope. In the preferred embodiment of the present invention, either a charge term or a current term that depends on present and past values of the modulation envelope is provided by each device routine. The sum of the charge terms at each carrier frequency is then differentiated to provide the sum of the envelope current terms.

5 Claims, 3 Drawing Sheets

METHOD FOR SIMULATING A CIRCUIT

FIELD OF THE INVENTION

The present invention relates to computer programs for simulating electronic circuits.

BACKGROUND OF THE INVENTION

The complexity of modern integrated circuits and the high cost of fabricating prototypes has led to the development of a class of computer programs that simulate the operation of a circuit. These simulators aid the designer in determining the proper bias voltages to be applied to the various components and in verifying the operation of the circuit before resources are committed to the fabrication of prototypes.

The circuit to be simulated is typically described in terms of a list of nodes and the components connected to each node. The user may actually provide a net list or a graphical representation of the circuit from which the program derives the net list. Each component may be viewed as a device that sources or sinks a current whose value is determined by the voltage at the node to which it is connected, and possibly, by the previous voltages at the node in question. The user may define particular components or utilize a library of standard components provided with the simulation program.

The simulation program finds the set of node voltages that lead to a circuit in which the sum of the currents at each node is zero. This is the voltage at which the currents provided by components that are the source of currents is exactly matched by the currents sinked by the remaining components. Each component is described by a subroutine that provides the current sinked or sourced by the component in response to an input voltage. As will be explained in more detail below, the component subroutines may also provide the first derivatives of the current with respect to the node voltages. In addition, the output of a component subroutine may depend on the history of the node to which the corresponding component is connected. For example, if the component contains inductors or capacitors, than the current will depend on the node voltage and the rate of change of the node voltage with time. The rate of change of the node voltage may be computed from the previous values of the node voltages, i.e., the "history of the nodes".

The simplest type of simulation determines the steady state behavior of the circuit, i.e., its DC operating conditions. Such simulations are particularly useful in setting various bias voltages on key nodes in the circuit. Under steady-state conditions, the solution of the simulation problem typically reduces to the solution of a system of non-linear equations that must be solved by some iterative approach such as Newton-Raphson iteration. The number of equations in the system is at least N, where N is the number of nodes in the circuit.

The simulation of the circuit under transient or large signal operating conditions is substantially more complex. Typically, the designer wishes to determine the voltage as a function of time at one or more nodes in the circuit when an input node is connected to a voltage source that varies with time. As noted above, one or more of the circuit components will sink or source currents whose value depends on the rate of change of the node voltage as well as the node voltage itself. Hence, the requirement that the currents entering a node are balanced by the currents leaving the node leads to a system of differential equations. A circuit having N nodes is now described by a system of at least N equations. Furthermore, the equations corresponding to devices having inductors or capacitors will be differential equations.

Numerical methods for solving such systems of non-linear differential equations are known. These methods typically require an iterative process at each time point. Hence, the solution of the transient simulation problem is substantially more complex computationally than the solution of the DC simulation.

Furthermore, the solution must be repeated at each time point. The spacing of the time points is typically determined by the highest frequency expected at any node having a component connected thereto whose output depends on the rate of change of the node voltage, i.e. the first derivative of the node voltage. The first derivative is determined by fitting the current node voltage and one or more previous node voltages to a curve. The slope of the curve is then used as an approximation to the first derivative. If successive time points are too far apart, the approximation will lead to a significant error in the first derivative. It should be noted that such an error is equivalent to making an unknown error in an inductor or capacitor value in the circuit. Hence, simulations of transients will have errors that increase with the time step size. Thus, the required number of steps per second may be an order of magnitude higher than the highest frequency at the most sensitive node.

Consider a simulation in which the input signal to the circuit is a 10 kHz modulation of a 10 GHz microwave signal. To view the circuit response over 10 cycles of the modulation envelope, i.e., one millisecond, with a step size equal to one tenth the period of the carrier, the circuit behavior must be computed at 100 million time points. If the behavior at each of 1000 nodes is to be recovered, the storage space for the results alone becomes a problem.

If the input wave form is periodic, the computational difficulty can be substantially reduced using harmonic balancing methods for computing the behavior of the circuit. In this case, the input signal may be written as a sum of sinusoids having fixed amplitudes. Each circuit component must provide the current sourced or sinked by that component in response to each of the sinusoids at the node connected to the component. If the input signal is represented by 10 sinusoids, the component must provide 10 current values plus the currents at harmonics of these values. It should be noted that each current is a complex number representing the current's amplitude and phase. The currents at the harmonics are needed because a non-linear device may excite one or more harmonics of an input signal. The simulation problem is then reduced to solving a set of non-linear equations in which the currents entering and leaving each node at each frequency are balanced.

The harmonic balance technique provides its advantages by eliminating the need to compute solutions at each time point. In this case, the solution of the system of non-linear equations provides the steady state solution to the simulation problem. However, the system of equations is now n times larger, where n is the number of harmonics for which each device must provide current data. Hence, the harmonic balance technique is limited to simulations for which the available computing system can solve a system of equations of order nN, where N is the number of nodes.

In addition, as noted above, the harmonic balance method is also limited to those situations in which the input signal is periodic. In many situations of interest, the input signal is not periodic. For example, the modulation of a carrier by a data stream is typically leads to a non-periodic waveform. These problems can only be solved by time-domain analysis. As noted above, if the carrier frequency is much higher than the modulation frequency, the number of time points needed to simulate the circuit using time-domain analysis becomes prohibitively large. Hence, there is a large class of problems for which both time-domain and harmonic balance simulators are less than satisfactory.

Two other related prior art methods, the mixed frequency-time (MFT) method and the envelope following method, have been developed in an attempt to overcome the above described problems. Both these techniques rely on being able to iteratively solve for the complete waveform over one clock period using basic time domain integration techniques. Several clock cycles are then skipped before another clock period segment is solved. These techniques reduce the number of time points for which solution must be computed. However, the computational difficulty is substantially increased because there are now boundary relationships that must also be satisfied between one clock period segment and the adjacent clock period segments. The MFT approach assumes the waveform, after being sampled at the clock rate, can be represented by a small number of harmonics n. This sampled waveform can then be represented by $2*n-1$ time samples. For each of these time samples, the circuit equations are integrated from the initial values to obtain the values one clock period later. Fourier techniques are then used to delay the set of initial values one clock period. Both these sets of delayed values must be equal, so a set of nonlinear equations are defined that equate these values to each other. This set of nonlinear equations is then solved with Newton-Raphson-based shooting methods. This requires not only repeatedly integrating the circuit equations but also repeatedly computing the sensitivities of the integrated results. If the number of harmonics n is large, solving this large set of equations can be become quite time consuming, and the benefit gained by not having to solve the circuit equations for every clock period can be lost. As with harmonic balance simulation, this MFT approach is practically limited to finding the steady state solution when a relatively few number of harmonics and tones of the sampled waveform are present, and its speed and efficiency is a strong function of how linearly the circuit is behaving from one time sample to the next.

The envelope following method is similar to the MFT in that it requires the integration of the circuit equations over a complete clock period, along with the sensitivities, but instead of using frequency domain techniques, it uses a "differential-like" time domain equation to relate the solution at one clock period to the solution several clock periods earlier. The number of clock periods that can be skipped depends on how rapidly the envelope is changing. In order for this to a be a stable algorithm, an implicit integration analogous to backward-Euler must be used. As a result, the method becomes an iterative process, and the circuit equations and sensitivities for the single clock period may have to be integrated multiple times.

Both the above techniques rely on being able to solve the circuit equations over single clock periods in the time domain. This constraint limits the methods to circuit models with lumped elements, i.e.. capacitors and inductors, because the models cannot use convolution or require past history information, since past history is not available for those clock periods that are skipped. Such models cannot accurately describe many circuits used in high-frequency communication circuits. The MFT approach cannot handle true transient or very complex modulation waveforms. Both approaches, in order to achieve the convergence rate of Newton-Raphson techniques, require the computation of a time domain sensitivity matrix which is expensive to compute and requires the inversion of a full, rather than a sparse, matrix. In addition, both these approaches just generate time domain waveforms. Basic envelope information, such as instantaneous magnitude, phase or I/Q, is not available, either for use in the simulation itself or for convenient display. The generation of this information requires another time consuming postprocessing step.

Broadly, it is the object of the present invention to provide an improved method for simulating an electronic circuit on a computer.

It is a further object of the present invention to provide a simulator that can simulate multiple modulated carriers and harmonics in which the modulation frequencies are small compared to the carrier frequencies.

It is yet another object of the present invention to provide a simulator that is not limited to circuit models having lumped elements.

These and other objects of the present invention will become apparent to those skilled in the art from the following detailed description of the invention and the accompanying drawings.

SUMMARY OF THE INVENTION

The present invention may be viewed as a combination of a harmonic balance simulator and a time domain simulator. The stimulating signal is represented by one or more carriers having time varying modulation envelopes. The simulator differs from a harmonic balance simulator in that the currents provided by each of the device subroutines include an additional term at each carrier frequency having the time dependency of the modulation envelope at that frequency. These additional current terms necessitate a time-domain solution of the simulation problem; however, the time steps are now determined by the time variation of the envelope instead of the time variation of the carrier. As a result, the number of time steps needed in the simulation is greatly reduced. The present invention may be implemented by modifying a conventional harmonic balance simulator. The modifications involve adding code to the various device routines to provide the current term corresponding to the modulation envelope. In the preferred embodiment of the present invention, either a charge term or a current term that depends on present and past values of the modulation envelope is provided by each device routine. The sum of the charge terms at each carrier frequency is then differentiated to provide the sum of the envelope current terms.

DETAILED DESCRIPTION OF THE INVENTION

Figure 1:
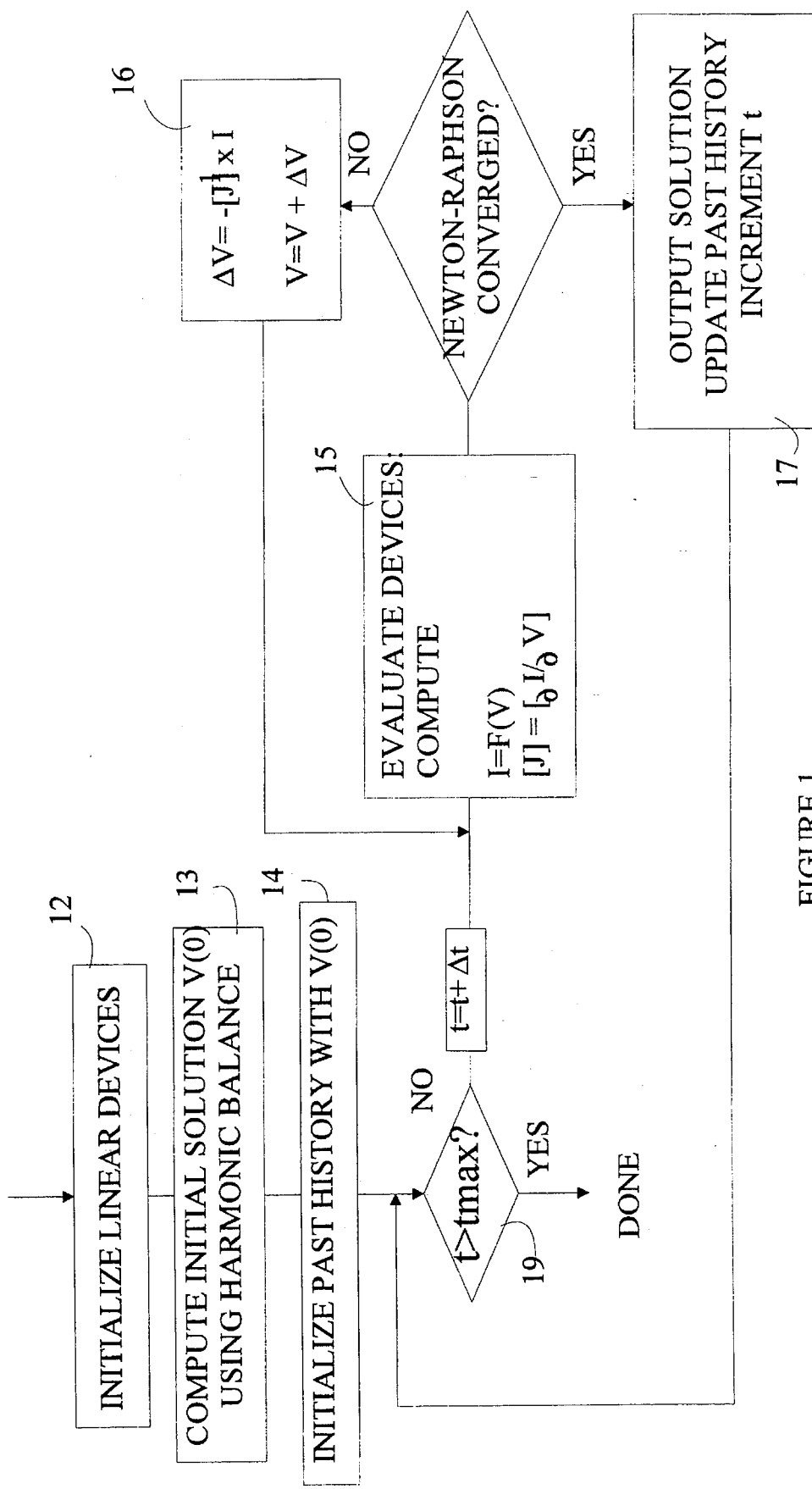
FIG. 1 is a flow chart of the overall time-domain computation implemented by a simulator according to the present invention.

The method of the present invention may be viewed as applying time-domain techniques on top of the frequency domain harmonic balance solution. The present invention assumes that the input stimulus waveforms can be represented by a small number of carriers modulated by time varying envelope whose rate of change is small compared to that of the carrier sinusoid. If the stimulus waveform is denoted by v(t), then $$v(t) = Real \left( \sum_{k=0}^{K} V_k(t) e^{j\omega_k t} \right) \quad (1)$$

In contrast to the standard harmonic balance solution where each of the $V_k$ terms is a complex constant representing the steady state value of a discrete tone, the present invention replaces each of these terms by a complex valued function of time $V_k(t)$ that may represent an arbitrary spectrum around each of the carriers. This spectrum may represent transient signals with their continuous spectrum. The present invention can also model periodic signals with their discrete spectral lines. As will be discussed in more detail below, a simulator according to the present invention has the fundamental advantage over time domain simulators in that the time stepsize is dictated only by the bandwidth of the modulation envelope, and not by any carrier frequency.

As noted above, circuits under simulation are described by nodes that connect various circuit elements. Each circuit element provides a current in response to the input voltages on the various nodes to which the circuit element is connected, and perhaps the history of these input voltages. The modifications needed to accommodate the waveform given in Eq. (1) may be more easily understood by describing the changes in the device currents relative to those provided in simulators based on the harmonic balance approach.

As noted above, harmonic balance simulators solve a system of equations at each harmonic frequency for each node in the circuit. Thus, if there are K harmonics in the waveform, the simulator describes each node by a set of K equations, each equation representing the sum of the currents at one of the harmonic frequencies. The code describing each element provides the contribution of the corresponding element at that frequency in response to a request providing voltages at each of the node to which the circuit element is connected. If a Newton-Raphson algorithm is to be used to find the solution, then each subroutine must also provide the first derivative of the current as a function of the node voltages.

Similarly, the present invention requires the solution of a system of equations in which the equations describing each node include one equation for each frequency. The code describing each of the circuit elements must provide the contribution of the circuit element at each of the carrier frequencies. In addition, the code must provide the first derivatives if a Newton-Raphson algorithm is being employed to solve the system of equations.

For linear and nonlinear resistive elements, including, for example, diode nonlinearities, where the current is an algebraic function of the voltage, the equations do not involve time derivatives or past history. Hence, the harmonic balance and present invention implementation of code describing such devices are identical. The routine describing the element provides an output $$I_k = F_k(v(t)), \text{ for } i=1, \ldots N \quad (2)$$

where $F_k(v)$ is the current at frequency $\omega_k$ generated by the device in question. The derivatives needed to solve the system using Newton-Raphson algorithm are identical to those already computed by a harmonic balance simulator, and are determined from the time domain derivative waveform $$\frac{df(v(t))}{dv},$$

where the element's output current in response to voltage v(t) is given by f(v(t)).

For linear capacitors, the equations used in a conventional harmonic balance simulator must be modified. The current provided by a capacitor is given by $$i(t) = C \frac{dv(t)}{dt} \quad (3)$$

In a conventional harmonic balance simulator, each element provides a current at the $k^{th}$ harmonic equal to $j\omega_k C V_k$. In a simulator according to the present invention, the current provided by the code describing a capacitor for the $k^{th}$ harmonic is given by:

$$I_k = j\omega_k C V_k(t) + \frac{d(CV_k(t))}{dt} \quad (4)$$

The first term is identical to the harmonic balance steady-state term for the carrier amplitude at the present time point. The second term represents the transient envelope current at frequency k caused by a time varying change in the envelope voltage at frequency $\omega_k$. This derivative term can now be computed using the normal discretized approximation with a step size that is limited only by the second derivative of the envelope voltage at frequency k. Hence, it will be apparent that steps that are small with respect to the envelope voltage change are all that are required. The derivatives needed for the Newton-Raphson algorithm may be approximated by $$\frac{dI_k}{dV_k} = j\omega_k C + \frac{2C}{\Delta t} \quad (5)$$

where $\Delta t$ is the step size in the time domain. Again, the first term is that provided by a conventional harmonic balance system. The second term is added by the present invention. Equation (5) implements a 2-point numerical differentiation formula. It will be apparent to those skilled in the art that other numerical differentiation formulae may be used. However, it should be pointed out that an error in the differentiation will, at most, reduce the rate of convergence of the Newton-Raphson algorithm.

The envelope technique of the present invention may also be used to model devices with an arbitrary frequency response H(s). The precise approach to modeling such a device depends on the envelope bandwidth around each carrier and the characteristics of the frequency response. Consider a device that can be modeled by a convolution, i.e., $$i(t) = h(t) \oplus v(t) \quad (6)$$

It can be shown that the current provided at the $k^{th}$ carrier by such a device is given by $$I_k(t) = V_k(t) \oplus (h(t) e^{-j\omega_k t}) \quad (7)$$

It can be seen from a Fourier transform of this expression that the frequency response of the device is given by $$I_k(s) = V_k(s) * H(s - j\omega_k) \quad (8)$$

The $H(s - j\omega_k)$ term is the frequency response centered around the $k^{th}$ carrier and will be referred to hereinafter as $H_k(s)$. Hence, the problem is reduced to the representation used for $H_k(s)$. If $H_k(s)$ is relatively constant over the envelope bandwidth, then it can be treated as a constant. Then the convolution becomes a multiplication. It should be noted that each carrier frequency can still have a different frequency response.

For cases with significant frequency response variation over the envelope bandwidth, FFT techniques can be used to generate a FIR (Finite Impulse Response) model, with which standard convolutions can be performed in an analogous fashion as is done with baseband convolution in prior art systems such as the Hewlett Packard HP 5154A High Frequency Transient Simulator. The main differences are that the impulse responses and waveforms are now complex and not just real valued. In addition, there is potentially a different impulse response for each of the carrier frequencies. Another alternative is to use stable curve-fitting algorithms to generate an IIR (Infinite Impulse Response) model. This is equivalent to approximating $H_k(s)$ with a rational polynomial $$\frac{N(z)}{D(z)}$$

instead of a polynomial series P(z). This approach requires the implementation of recursive convolution in the simulator. In this case, past values of the input and output values must be stored an made available to the various device subroutines.

Finally, $H_k(s)$ can be modeled by using an existing full bandwidth impulse response generator to provide h(t). Code for such an implementation is available in some prior art simulators such as the HP Impulse simulator mentioned above. From this h(t), the various $h_k(t)$ impulse responses can be computed by mixing with $e^{-j\omega_k t}$ and then properly filtering and decimating it to match the bandwidth and time step of the simulator.

From the above discussion, it will be apparent that an envelope circuit simulator according to the present invention has the fundamental advantage over time domain simulators in that the time stepsize is limited only by the bandwidth of the modulation envelope, and not by any carrier frequency. For example, assume a 5 GHz signal with a significant $3^{rd}$ harmonic. To satisfy the basic Nyquist criteria, the sampling frequency must be greater than 30 GHz. To obtain reasonable accuracy from the integration algorithms, a sampling frequency of 100 GHz is a realistic minimum. Now assume that the carrier is modulated with a symbol rate of 100 kHz, and that we want to simulate the circuit for 500 symbols. This means that we desire a total simulation time of 5 msec. However, the high carrier frequency dictates that the time step size must be 10 psec or smaller. As a result, a prior art simulator would require more than 500 million time points. In contrast, the envelope simulator of the present invention would have four carrier frequencies: DC, the fundamental of 5 GHz and the second and third harmonics at 10 and 15 GHz. Assuming a double sided spectrum of 200 kHz, a sample rate of 1 MHz provides sufficient accuracy; hence, only 5000 time points must be computed to get the 5 msec time record.

Another limitation of time domain based simulators, including both Spice-like and Nitswit-like simulators, is that the accuracy of any numerical integration routine degrades at higher frequencies, relative to their low frequency or DC accuracy. For example, using a standard trapezoidal second order integration technique just to compute the current through a capacitor at a given carrier frequency requires that the sample rate be 10 times the carrier frequency for one percent accuracy and about 32 times the carrier frequency for 0.1 percent accuracy. For modulation carrier applications, the best accuracy should be at the carrier frequency, not DC, since that is where the information is centered. For these time domain simulators, the accuracy is best at DC and falls off at higher frequencies.

In contrast, an envelope simulator according to the present invention performs multiple integrations with each one centered around a carrier frequency. Thus, the best accuracy is achieved right at each carrier frequency, and any decrease in accuracy due to time domain integration only applies to the outer modulation frequencies around each carrier. The envelope time step must be set small enough to maintain the desired accuracy of the envelope spectrum, but the accuracy at and very close to the actual carriers is equal to the steady-state, full accuracy of the basic harmonic balance simulator.

Yet another advantage of an envelope circuit simulator according to the present invention lies in the immediate availability of the instantaneous amplitude, phase, and I/Q information of each carrier. This information may be used in the simulator itself to create efficient models of items like magnitude, power, phase or frequency detectors, or it may be used in to display the desired results to the user. No additional, lengthy and error introducing calculations are required to convert the time domain waveform into envelope information.

An envelope simulator according to the present invention has essentially all of the advantages of harmonic balance simulators. Frequency domain models are more effectively and accurately incorporated into the circuit equations. If an arbitrary frequency response H(s) does not vary significantly over the modulation bandwidth, then it may be implemented via a simple multiplication, in contrast to the lengthy convolution required in time-domain simulators. Yet, the response can still have significantly different values at each carrier frequency. Even in those cases in which there is some frequency response variation of H(s) over the modulation bandwidth at a particular carrier, the convolution required with an envelope simulator according to the present invention are much shorter and faster convolutions. The convolutions required in the present invention only have to represent the frequency response over the relatively narrow modulation bandwidth, as opposed to the entire range of DC to the maximum frequency required in time-domain simulators.

An envelope circuit simulator according to the present invention also shares the advantage of harmonic balance simulation, in that the solution can start from a steady-state solution. The envelope simulator can start its simulation with all the carrier, local oscillators, RF, and DC waveforms at their steady state value. There is no need to wait, as with most time domain simulators, for the circuit to achieve steady state. Therefore, the envelope simulator can start its simulation of how the modulation envelope varies with time, without having to wait for the transients to die out. However, the present invention does not share the limitation of a harmonic balance simulator's inability to simulate this start-up transient, if desired. The RF, local oscillators, and even the DC sources can be turned on at time t=0, so that the full start-up transients can be observed. Hence, the present invention shares most of the advantages of both time and frequency domain simulators.

When compared with normal harmonic balance simulation, the envelope circuit simulator of the present invention requires fewer tones. As a result, the matrices that must be inverted are substantially smaller than those encountered with harmonic balance simulators. The modulation information does not have to be represented as separate tones as in the normal harmonic balance system of equations where all frequency components must be solved for simultaneously. Typically, just the carriers, local oscillator, RF, and IF frequencies, together with the significant intermodulation frequencies and harmonics, need to be included in envelope simulation. The modulation information typically appears as a time varying baseband waveform or envelope.

Having explained the general manner in which an envelop simulator according to the present invention operates, a more detailed discussion of the implementation of the present invention will now be given. To simplify the following discussion, the following discussion will focus on those additional elements that must be added or changed in a conventional harmonic balance simulator to implement the present invention. Those not skilled in harmonic balance simulators are referred to Kundert, et al., *Steady-State Methods for Simulating Analog and Microwave Circuits*, Kluwer Academeic Publishers, 1990.

In the preferred embodiment of the present invention, the individual devices having capacitors do not need to compute the $$C \frac{dV_k}{dt}$$

term. Instead a charge vector, in addition to the standard current vector, is utilized. The capacitive devices only have to compute their contribution to the charge, $CV_k(t^n)$. After all of the devices have loaded their charge and current, standard current vector, is utilized. The capacitive devices only have to compute their a global routine then performs the differentiation of charge. This additional current is then added to the standard current vector.

For non-linear capacitors, it can be shown that $$I_k = j\omega_k Q_k + \frac{dQ_k}{dt} \tag{9}$$

and $$\frac{dI_k}{dV_p} = \left( j\omega_k + \frac{2}{\Delta t} \right) \frac{dQ_k}{dV_p} \tag{10}$$

Hence, the routines that load charge into the current vector can perform the differentiation by multiplying by $j\omega_k$. This operation is also required for the harmonic balance portion of the computation; hence, the routines in question perform the multiplication both for the normal harmonic balance portion, and, in addition, load the charge into the charge vector, which as described above, is later differentiated in time and added to the current vector. Similarly, the derivative that is needed for the Newton-Raphson Jacobian matrix has the standard harmonic balance portion, and, in addition, now also has the new envelope portion.

It should be noted that the above equations and examples describe only nonlinear current and charges as functions of voltage. However, by using the Modified Nodal Analysis structure of the simulator, nonlinear fluxes, charges, currents, and voltages that are functions of either voltage or current can be supported with the same generalized equations. The reader is directed to Vlach, et al., *COMPUTER METHODS FOR CIRCUIT ANALYSES AND DESIGN*, Van Nostrand Reinhold, N.Y. 1983, for a more detailed discussion of analyses..

Refer now to FIG. 1 which is a flow chart of the overall time-domain computation. The process begins by initializing the linear devices as shown at 12. This process will be discussed in more detail below with reference to FIG. 2. The initial solution V(0) is then computed using conventional Harmonic Balance methods as shown at 13. The initial solution is also used to initialize the "past history" as shown at 14. The basic time stepping loop is shown at 19. For each time step, the code corresponding to each device in the simulated circuit computes its current I and contribution to the Jacobian matrix, J, where $$[J] = \left[ \frac{\partial I}{\partial V} \right]$$

shown at 15. If the solution has converged, the solution is outputted and the past history updated as shown at 17. If the solution has not converged, a new set of voltages are computed for the circuit nodes as shown at 16, and the devices once again compute their currents and contributions to the Jacobian.

Figure 2:
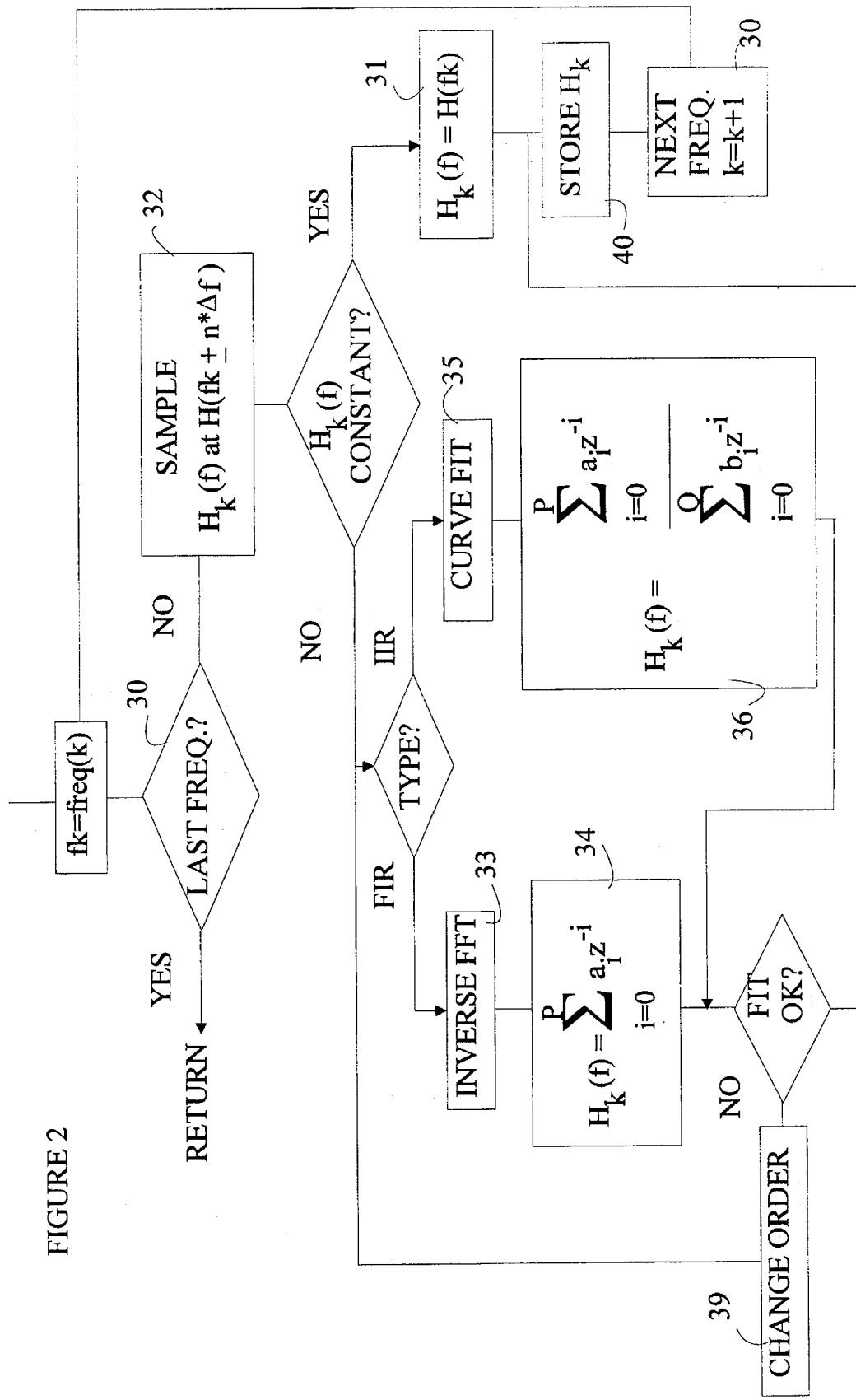
FIG. 2 is a more detailed flow chart for the code for initializing the linear devices.

Refer now to FIG. 2 which is a more detailed flow chart for the code for initializing the linear devices. The loop shown at 30 is carried out for each carrier frequency in the array freq(k). If the frequency response around the carrier is relatively constant, $H_k(f)$ is modeled with the steady state value as shown at 31. To determine if Hk(f) is sufficiently constant, H is sampled at a number of frequencies around the carrier frequency as shown at 32.

If the response is not constant, the program proceeds to find an FIR model or an IIR model for the frequency response. The choice is based on input from the circuit designer. Alternatively, the program can attempt both types of fit and select the one providing the best fit. The FIR model utilizes an inverse FFT to model $H_k(f)$ as shown at 33–34, while the IIR model uses curve fitting with a rational polynomial as shown at 35–36. The program checks the fit of each model to the criteria provided by the circuit designer and adjusts the order of the model until the model fit is satisfactory as shown at 39. When an adequate fit for $H_k(f)$ is obtained, the values are stored and the frequency incremented to the next carrier frequency. As shown at 40.

Figure 3:
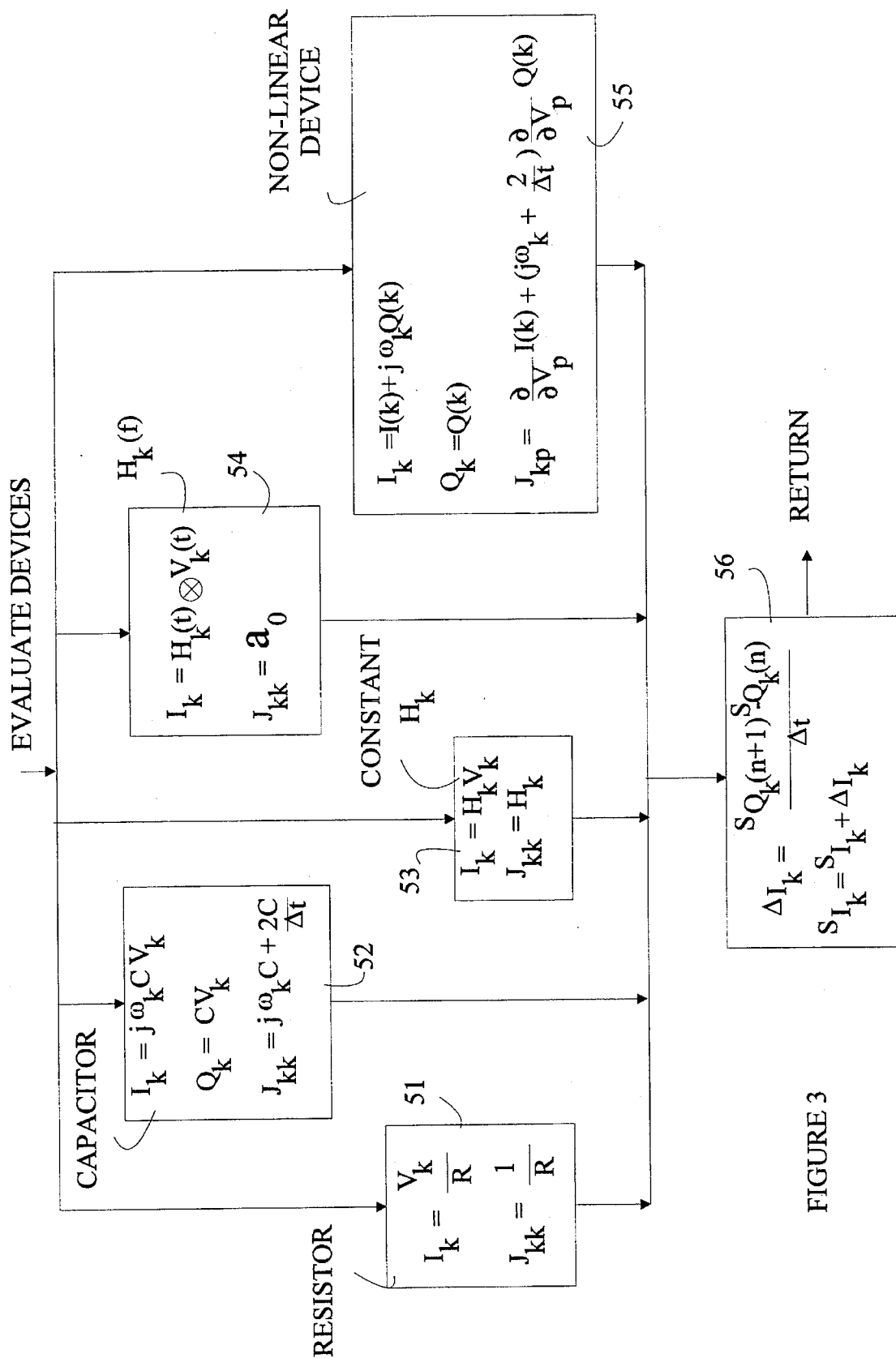
FIG. 3 is a more detailed flow chart for the code used to evaluate the devices as shown in FIG. 1.

Refer now to FIG. 3 which is a more detailed flow chart for the code used to evaluate the devices as shown in FIG. 1 at 15. Each device is represented by a subroutine that provides three types of information for each carrier frequency. The first two quantities are complex valued scalars representing the current $I_k$ at the $k^{th}$ carrier frequency and the charge $Q_k$ stored by the device at the $k^{th}$ carrier frequency. For non-capacitive devices, $Q_k$ will be 0. The third quantity is the contribution to the Jacobian Matrix, $J_{ij}$, used in the Newton-Raphson method. For linear devices, the contribution is only to the diagonal element $J_{kk}$ of the matrix. For non-linear devices, off-diagonal terms will, in general, be returned by the device code. The contributions provided by resistors, capacitors, and linear devices having constant frequency variation over the carrier envelope are shown at 51–53, respectively. Since these contributions have been discussed in detail above, they will not be discussed further here.

The contributions for linear devices with non-constant response over the carrier envelope are shown at 54. The contribution to the Jacobian is the constant term from the series expansion determined in the modeling of the device.

For non-linear devices, the contributions are shown at 55. In general, the contributions will depend on the specific characteristics of the device. Methods for computing the current and charge stored by a device are known to those skilled in the arts, and hence, will not be discussed in detail here. For the purposes of the present discussion, it is sufficient to note that the subroutine will provide the current at the $k^{th}$ carrier, I(k), and the charge stored at the $k^{th}$ carrier frequency, Q(k), as shown at 55. The contribution to the Jacobian will depend on the derivatives of these quantities as shown at 55.

When all of the devices connected to a given node have returned their contributions for all carrier frequencies, the currents are incremented by the derivative of the charges summed from each device as shown in at 56. It should be noted that the $^SQ_k$ shown at 56 are sums of the $Q_k$'s provided by each of the devices connected to the node for the $k^{th}$ carrier. Similarly, the $^SI_k$'s are the sums of the currents provided at the $k^{th}$ carrier by each of the devices.

The above discussion has emphasized devices which provide a current as a function of voltage such as resistors and capacitors. It will be apparent to those skilled in the art from the above discussion that the teachings of the present invention may be extended to inductors and other devices which provide a voltage as a function of current by a modified nodal analysis. Since, such analyses are well known in the art, a detailed discussion of new equations that must be solved in addition to those discussed above will not be undertaken here.

While the above described embodiments of the present invention utilize Newton-Raphson methods for solving the node equations, it will be apparent to those skilled in the art that other methods for solving the node equations can be utilized without departing from the teachings of the present invention. For example, the nodal equations can be solved using "annealing" techniques which do not require the computation of the derivatives of the currents with respect to the various node voltages.

Various modifications to the present invention will become apparent to those skilled in the art from the foregoing description and accompanying drawings. Accordingly, the present invention is to be limited solely by the scope of the following claims.

What is claimed is:

1. In a method for simulating the response of a circuit to a stimulating signal using a digital computer, said circuit being represented by a plurality of nodes, each said node being connected to one or more devices, each said device corresponding to a computer routine that provides the current sourced by the corresponding device when said nodes are held at a set of potentials provided to said routine, the improvement comprising the step of approximating said stimulating signal, v(t), by $$v(t) = Real\left( \sum_{k=0}^{K} V_k(t)e^{j\omega_k t} \right)$$

where $V_k(t)$ is a time varying voltage, and $K \geq 0$.

2. The method of claim 1 wherein said computer routine corresponding to a capacitor having capacitance C provides K current values in response to said set of node potentials, the $k^{th}$ said current being given by $$I_k = j\omega_k CV_k(t) + \frac{d(CV_k(t))}{dt}.$$

3. The method of claim 1 wherein said computer routine corresponding to a capacitor having capacitance C provides K current values in response to said set of node potentials, the $k^{th}$ said current being given by $$I_k = j\omega_k CV_k(t),$$

wherein said computer routine further provides the K charge values, the $k^{th}$ charge value being given by $$Q_k = CV_k(t)$$

and wherein said method further comprises the steps of summing the Qk values provided by said computer routines to obtain a total charge corresponding to each value of K, and computing an approximation of the rate of change of said total charge with time.

4. The method of claim 1 wherein each said computer routine provides first and second currents when said method is simulating the operation of said circuit at time T, said first current corresponding to the current sourced by said corresponding device when said circuit is connected to a steady state stimulating signal having an amplitude given by $$v'(t) = Real\left( \sum_{k=0}^{K} V_k(T)e^{j\omega_k t} \right)$$

and wherein said second current has a time dependence that is determined by said $V_k(t)$, for k=0 to K.

5. The method of claim 1 wherein one of said devices is a linear convolutional device and wherein said method further comprising the step of approximating the response of said linear convolutional device with either a Finite Impulse Response or an Infinite Impulse Response.

\* \* \* \* \*